US010202704B2

(12) United States Patent
Luter et al.

(10) Patent No.: US 10,202,704 B2
(45) Date of Patent: Feb. 12, 2019

(54) SIDE FEED SYSTEM FOR CZOCHRALSKI GROWTH OF SILICON INGOTS

(71) Applicant: GTAT IP HOLDING LLC, Merrimack, NH (US)

(72) Inventors: William L. Luter, St. Charles, MO (US); Verlin A. Lauher, Baldwin, MO (US); Dick S. Williams, St. Charles, MO (US); Howard P. Zinschlag, Chesterfield, MO (US); Neil Middendorf, St. Louis, MO (US); David J. Dubiel, Goffstown, NH (US)

(73) Assignee: GTAT IP HOLDING LLC, Merrimack, NH (US)

( * ) Notice: Subject to any disclaimer, the term of this patent is extended or adjusted under 35 U.S.C. 154(b) by 285 days.

(21) Appl. No.: 13/651,981

(22) Filed: Oct. 15, 2012

(65) Prior Publication Data
US 2013/0098290 A1 Apr. 25, 2013

Related U.S. Application Data

(63) Continuation-in-part of application No. 13/446,414, filed on Apr. 13, 2012, now abandoned.
(Continued)

(51) Int. Cl.
C30B 15/00 (2006.01)
C30B 15/12 (2006.01)
C30B 29/06 (2006.01)

(52) U.S. Cl.
CPC ............ C30B 15/002 (2013.01); C30B 15/12 (2013.01); C30B 29/06 (2013.01); Y10T 117/1056 (2015.01)

(58) Field of Classification Search
CPC ........ C30B 15/002; C30B 15/12; C30B 29/06
(Continued)

(56) References Cited

U.S. PATENT DOCUMENTS 5,037,503 A   8/1991   Kajimoto et al.
5,080,873 A * 1/1992   Ono .................. B01J 4/001
                                                117/213
(Continued)

FOREIGN PATENT DOCUMENTS

EP    1 553 214 A2   7/2005
JP    H01-148780 A   6/1989
(Continued)

OTHER PUBLICATIONS

International Search Report dated Nov. 30, 2012 for PCT/US2012/033606.
(Continued)

Primary Examiner — Hua Qi
(74) Attorney, Agent, or Firm — Parker Ibrahim & Berg LLP; Stephen D. LeBarron

(57) ABSTRACT

A Czochralski growth system is described comprising a growth chamber, a feed port, and a feed chamber comprising a container for feedstock and a feeder. The feed port is disposed in at least one side wall of the growth chamber, and the feed chamber is attached to the growth chamber at the feed port. The feeder is insertable into the growth chamber through the feed port and supplies the feedstock into the growth chamber. Preferably this system can be used for producing silicon ingots using a continuous Czochralski method.

10 Claims, 5 Drawing Sheets

Related U.S. Application Data

(60) Provisional application No. 61/477,435, filed on Apr. 20, 2011.

(58) Field of Classification Search
USPC .......................................................... 117/216
See application file for complete search history.

(56) References Cited

U.S. PATENT DOCUMENTS

| | | | | |
|---|---|---|---|---|
| 5,312,600 | A | * | 5/1994 | Kamio .................... C30B 15/14 117/213 |
| 5,324,488 | A | * | 6/1994 | Klingshirn et al. .......... 117/213 |
| 5,462,010 | A | * | 10/1995 | Takano et al. .................. 117/14 |
| 5,580,171 | A | | 12/1996 | Lim et al. |
| 5,858,087 | A | * | 1/1999 | Taguchi .................. C30B 15/02 117/213 |
| 7,001,456 | B2 | * | 2/2006 | Nakashima ............. C30B 15/02 117/208 |
| 2003/0159647 | A1 | * | 8/2003 | Arvidson ................ C30B 15/02 117/30 |
| 2009/0158993 | A1 | * | 6/2009 | Sahr ...................... C30B 11/003 117/73 |
| 2011/0006240 | A1 | * | 1/2011 | Williams .................. F16K 3/06 251/337 |

FOREIGN PATENT DOCUMENTS

| | | | |
|---|---|---|---|
| JP | H03-23286 | A | 1/1991 |
| JP | 09-175883 | A | 7/1997 |
| JP | 09175883 | A * | 7/1997 |
| JP | 2003-002779 | A | 1/2003 |
| JP | 2010-030853 | A | 2/2010 |
| WO | WO-91-13192 | A1 | 9/1991 |

OTHER PUBLICATIONS

Office Action dated Aug. 26, 2015 in connection with Japanese Application No. 2014-506468, with English translation.
Office Action dated Aug. 6, 2016 in connection with Chinese Application No. 201280029255.X, with English translation.
European Search Report dated Jul. 30, 2014 issued in connection with EP 12774195.

* cited by examiner

SIDE FEED SYSTEM FOR CZOCHRALSKI GROWTH OF SILICON INGOTS

CROSS-REFERENCE TO RELATED APPLICATIONS

The present application is a continuation-in-part of U.S. patent application Ser. No. 13/446,414, filed Apr. 13, 2012, which claims the benefit of U.S. Provisional Patent Application No. 61/477,435, filed Apr. 20, 2011.

BACKGROUND OF THE INVENTION

1. Field of the Invention

The present invention relates generally to Czochralski growth of crystalline ingots. In particular, the invention relates to a feed system for repetitively supplying feedstock for continuous Czochralski growth of crystalline ingots.

2. Description of the Related Art

Among the many types of photovoltaic solar cells being developed, one of the most efficient and economical cells is based on silicon wafers grown by the Czochralski method, similarly to that most prevalently used for silicon integrated circuits. In the Czochralski (CZ) method, silicon is melted in a crucible to its liquid state at a temperature of about 1420° C. A small crystalline silicon seed of predetermined crystalline orientation is contacted with the melt and then gradually withdrawn. With proper control of temperatures, the liquid silicon freezes on the crystalline seed with the same orientation as that of the seed. The seed is then slowly raised away from the melt to form a growing crystalline ingot of silicon having a final length typically of a meter or more and a diameter typically of hundreds of millimeters determined by the initial drawing conditions as the ingot expands from the diameter of the seed to the desired ingot diameter. In typical integrated applications, batch CZ is practiced in which the crucible is filled with an initial charge of electronic grade silicon, also called virgin poly or simply polysilicon. The crucible is then heated, one ingot is drawn to substantially deplete the crucible, and the crucible is discarded after one ingot. The cooled ingot is sliced to form circular monocrystalline wafers having a thickness of substantially less than a millimeter. See Wolf and Taber, Silicon Processing for the VLSI Era, vol. 1: Process Technology, Lattice Press, 1986, pp. 5-21, incorporated herein for reference, for discussions about electronic grade silicon and the typical Czochralski process.

Solar cell applications, however, are much more cost sensitive than silicon integrated circuits. In particular, the need to replace the crucible after each ingot imposes a high cost in crucibles and loss of the residual silicon left in the crucible. Also, the time required to replace the crucible and to reheat the crucible and its chamber greatly diminishes the throughput.

One general approach to reduce the cost of solar silicon involves continuous Czochralski (CCZ) growth, which has been known for many years but has not been widely practiced. It has recently been suggested for solar use. See U.S. Pat. No. 7,635,414 to Bender and U.S. Patent Application Publication No. 2011/0006240 to Williams et al. CCZ allows the drawing of multiple ingots from one crucible but requires the replenishment of fresh silicon into the generally small crucible while it is hot and most preferably while one of the ingots is being drawn from the crucible melt. However, the drawing of high-quality monocrystalline ingots requires tightly controlled temperatures, critical melt level control, and a non-reactive ambient such as argon. The replenishment of silicon feedstock to the Czochralski crucible is one of the challenges of CCZ.

Therefore, there is a need in the industry for a feed system capable of being used to continuously provide feedstock to a Czochralski growth system and, in particular, a continuous Czochralski growth system.

SUMMARY OF THE INVENTION

The present invention relates to a Czochralski growth system comprising a growth chamber, a feed port, and a feed chamber comprising a container for feedstock and a feeder. The growth chamber comprises a crucible, at least one sidewall, a top wall, a pedestal for supporting the crucible, and a pull mechanism for retractably supporting a seed for contacting a melt contained in the crucible. The feed port is disposed in at least one of the side walls of the growth chamber, and the feed chamber is attached to the growth chamber at the feed port. The feeder is insertable into the growth chamber through the feed port and supplies the feedstock into the growth chamber. In one embodiment, the growth system further comprises at least one isolation valve. For example, the isolation valve may be attached to the feed port in the growth chamber. Alternatively, or in addition, the feed chamber may further comprise an isolation valve, such as between the container and the feeder. In another embodiment, the growth system does not comprise an isolation valve in the feed port.

It is to be understood that both the foregoing general description and the following detailed description are exemplary and explanatory only and are intended to provide further explanation of the present invention, as claimed.

DETAILED DESCRIPTION OF THE INVENTION

Figure 1:
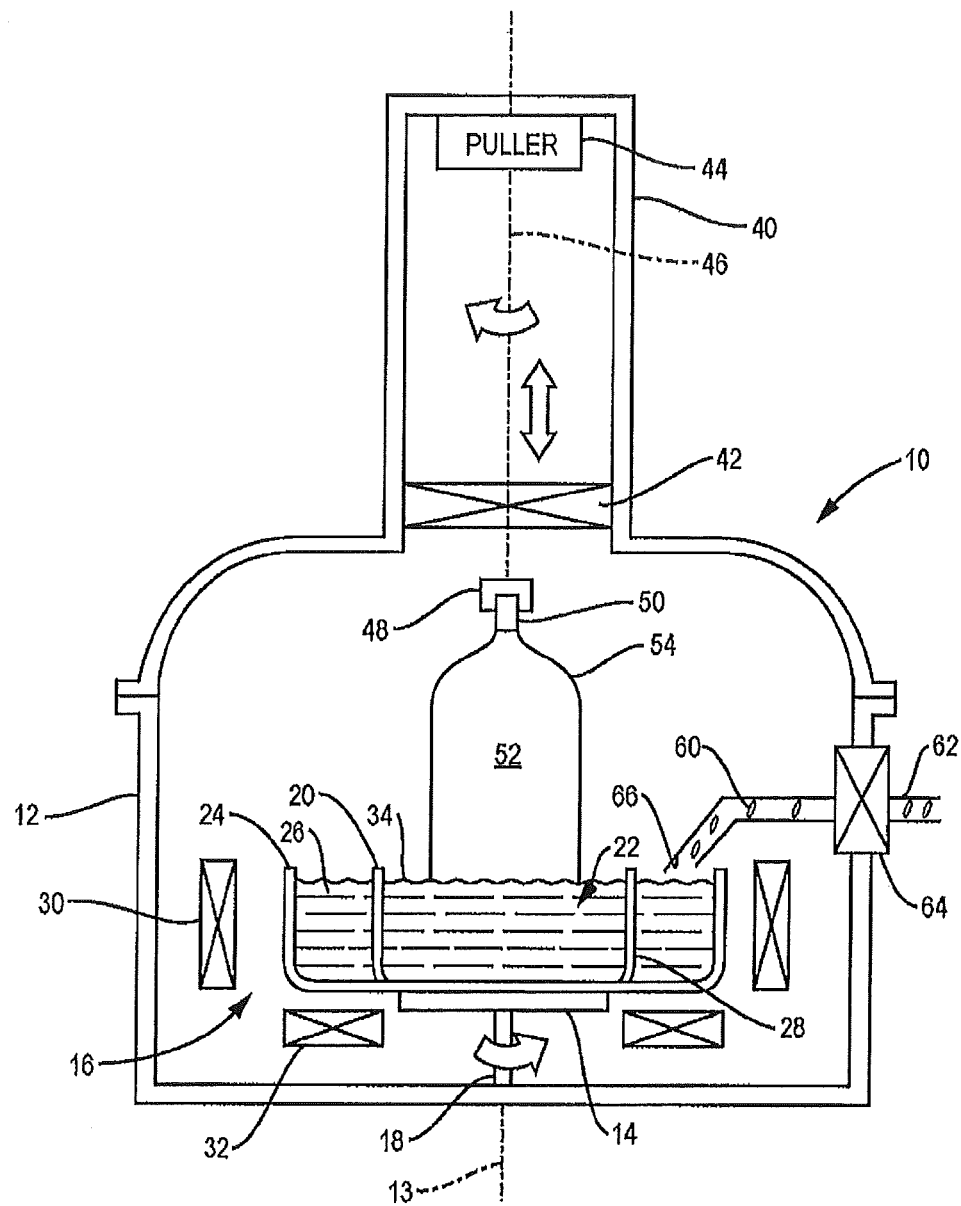
FIG. 1 is a cross-sectional view of an embodiment of the Czochralski growth system of the present invention.

The present invention relates to Czochralski growth systems, preferably a continuous Czochralski growth system, and to feeder systems for providing feedstock to a Czochralski growth system.

The Czochralski growth system of the present invention comprises a growth chamber in which an ingot, such as a silicon ingot, is produced. The growth chamber comprises at least one sidewall and a top wall forming a heatable space in which a crucible containing feedstock, such as silicon, is provided. The feedstock is melted in the crucible within the growth chamber, which can be supported from below by one or more pedestals, and a silicon ingot can be grown from the melt using any technique known the art. Thus, for example, the growth chamber can further comprise a pull mechanism in which a small crystalline silicon seed is supported, such as on a retractable cable, from the top wall of the growth chamber. The seed, having a predetermined crystalline orientation, is contacted with the melt and then gradually withdrawn. With proper control of temperatures, the liquid silicon freezes on the crystalline seed with the same orientation as that of the seed. The seed is then slowly raised away from the melt to form a growing crystalline ingot of silicon having a desired final length and diameter. One or more load cells supporting the pull mechanism can also be used, along with a control means responsive to the load cells for activating the supply of feedstock into the growth chamber.

The crucible in the growth chamber can be any known in the art for use in silicon crystal growing that is capable of containing both solid and liquid silicon feedstock. For example, the crucible can be a quartz crucible or can be a graphite crucible containing a quartz inner liner. The crucible can also have any cross-sectional shape depending, for example, on the geometry of the crystal growth system, but typically has a circular cross-sectional shape. Preferably, the crucible comprises an inner zone and an outer zone, and these zones are in fluid communication with each other. The inner zone is positioned under the pull mechanism and is therefore where growth is initiated while the outer zone contains feedstock which, when melted, feeds additional material to the inner zone as an ingot is grown. For example, the crucible can comprise a wall or other separating means that divides the crucible into the inner and outer zones. The separator has an opening, such as a hole or pipe, which provides restricted fluid communication between the two zones so that, as material is removed from the inner growth zone by the crystallization process, fresh material can enter from the outer feed zone.

The Czochralski growth system of the present invention is preferably a continuous Czochralksi growth system and further comprises at least one feed port in the growth chamber through which feedstock, such as silicon, is delivered as a silicon ingot is grown. The port can be disposed anywhere along the growth chamber, such as in at least one of the side walls or in the top wall but is preferably disposed in a side wall of the growth chamber for ease of delivery of feedstock. Furthermore, it is particularly preferred that the feed port be positioned in the side wall of the growth chamber at a height such that feedstock is delivered into the crucible without significant impact to a melt formed therein. For example, preferably the feed port is positioned so that feedstock enters the crucible from a height substantially similar to the height of the crucible. In addition, it is also preferred that the feed port is positioned so that feedstock enters the crucible substantially horizontally. For example, the feed port is preferably at a height such that the center of the port forms an overall path of delivery having an angle that is between 0° (i.e., horizontal) and about 45°, more preferably between about 0° and about 30°, and even more preferably between about 0° and about 20°. As such, a slight slope is preferred so that feedstock slowly and consistently enters the crucible without binding or clogging, but does not enter the crucible with a high enough velocity to cause splashing or rebound. In addition, the height and/or angle of the feed path can be adjustable within these parameters, including during the delivery of feedstock. By positioning the feed port so that feedstock is delivered from the side of the growth chamber at a low height and entry angle, ingots having improved overall properties can be produced using a continuous Czochralksi growth process.

Furthermore, the Czochralski growth system of the present invention also comprises a feed chamber which can be attached or sealed to the growth chamber at the feed port. The feed chamber comprises a container for feedstock, such as silicon, and a feeder, which supplies the feedstock into the growth chamber. Preferably, the feed chamber is attached to the growth chamber at the feed port and the feeder is both insertable into the growth chamber and also removable from the growth chamber back into the feed chamber through the feed port. Also, preferably the Czochralksi growth system further comprises a drop box fixed inside the growth chamber for receiving the feedstock from the feeder of the feed chamber. For example, the drop box can have a sloping bottom and a spout positioned over the crucible so that feedstock provided from the feeder can enter the drop box and is added to the crucible, without considerable splashing. The slope of the bottom of the drop box can vary depending on, for example, the height of the drop box above the crucible and the desired rate of feedstock addition. For example, the sloping bottom can be inclined at an angle of between about 30° and about 60°. For a crucible having inner and outer zones, preferably the spout of the drop box is disposed over the outer feed zone. The drop box can comprise any material known in the art that is capable of withstanding the temperatures and conditions in a high temperature crystal growth furnace, including, for example, a high modulus, non-contaminating material such as silicon carbide.

For example, the container of the feed chamber can comprise a hopper having a funnel with a bottom spout positioned over the feeder. For this example, the feeder can comprise a feeder pan formed of any material known in the art that is capable of withstanding the temperatures and conditions in a high temperature crystal growth furnace, including, for example, a high modulus, non-contaminating material such as silicon carbide. The feeder pan can comprise a receiving section in which feedstock is received from the container along with an injector section connected to the receiving section that can be inserted into the growth chamber, such as through an isolation valve described below. The spout of the hopper can be positioned within sidewalls of the receiving section. Preferably, the cross section of the injector section is smaller than that of the receiving section. Furthermore, the injector section can have a bottom that is concave in cross-sectional shape, including, for example, a V shape with walls that are oppositely included from the vertical. The slope of the concave bottom can vary depending on, for example, the amount of feedstock being fed into the growth chamber. For example, the walls of the injector section can have a slope of between about 30° and about 60°. Furthermore, the receiving section of the feeder pan can be supported by a vibrator which aids in the delivery of the feedstock. For example, the vibrator can be supported on the hopper of the container, and the hopper can be supported in the feed chamber by at least one load cell, which is capable of measuring the amount of material present.

In one embodiment of the present invention, the Czochralski growth system further comprises at least one isolation valve which isolates process conditions present on one side of the valve from different process conditions on the other side. For example, the isolation valve may be attached to a feed port in the growth chamber, thereby isolating conditions present within the growth chamber from those in the feed chamber. For this example, preferably the feed chamber is sealed, more preferably vacuum sealed, to the growth chamber at the isolation valve and the feeder is insertable into the growth chamber and also removable from the growth chamber back into the feed chamber through the isolation valve. Alternatively, or in addition, the feed chamber can comprise at least one isolation valve. For this example, the valve can be, for example, positioned between the feed hopper and the feeder, thereby isolating conditions present in the hopper from those around the feeder, which may be the same or similar to those in the growth chamber. Advantages of the use of an isolation valve are described below. The valve can be any known in the art but is preferably a gate valve with and expandable water-cooled gate, such as those described in U.S. Patent Application Publication Nos. 2011/0006235, 2011/0006236, and 2011/0006240, which are fully incorporated by reference herein. While the use of an isolation valve may be advantageous in some embodiments, the use of the valve is optional and, in another embodiment of the present invention, the growth system does not comprise any isolation valve.

When the Czochralski growth system of the present invention comprises an isolation valve in the feed port of the growth chamber, the system can further comprise one or more bellows connecting the isolation valve and feed chamber. The bellows can be connected to the isolation valve using any device known in the art, including, for example, a manually operating quick release coupling. In this way, the feed chamber is displaceable away from the growth zone. For example, when additional feedstock needs to be added to the feed chamber, the feeder can be retracted into the feed chamber from the growth chamber by displacement of the bellows, without disconnecting the feed chamber from the growth chamber. A shield system can also be used, interposed between the feeder, the isolation valve, and the bellows, if used. The shield system can be inserted into the growth chamber when the isolation valve is open and feedstock is being supplied and can further be withdrawn into the feed chamber when feeding is complete, the feeder is retracted, and the isolation valve is closed. For example, the shield system can comprise a back shield fixed to the feed chamber and a front shield that is projectable into the growth chamber and can be slid into the back shield.

Specific embodiments and components of the Czochralski growth system of the present invention are shown in FIG. 1-FIG. 6 and discussed below. However, it should be apparent to those skilled in the art that these are merely illustrative in nature and not limiting, being presented by way of example only. Numerous modifications and other embodiments are within the scope of one of ordinary skill in the art and are contemplated as falling within the scope of the present invention. In addition, those skilled in the art should appreciate that the specific configurations are exemplary and that actual configurations will depend on the specific system. Those skilled in the art will also be able to recognize and identify equivalents to the specific elements shown, using no more than routine experimentation.

An embodiment of a continuous Czochralski (CCZ) growth system 10 is schematically illustrated in the cross-sectional view of FIG. 1 and includes a growth chamber comprising crucible chamber 12 arranged about central axis 13 and enclosing pedestal 14 supporting double-walled crucible 16. Shaft 18 connected to an unillustrated motor rotates pedestal 14 and crucible 16 about central axis 13. Crucible chamber 12 includes ports for supplying an inert ambient gas such as argon and vacuum ports for exhausting the ambient gas and reducing the chamber pressure.

Crucible 16 includes inner wall 20 defining therein inner growth zone 22 and outer wall 24 defining, together with inner wall 20, outer annular feed zone 26. Aperture 28 in inner wall 20 provides restricted fluid communication between outer feed zone 26 and inner growth zone 22. Additional walls producing additional zones and other flow controls are possible. Solid silicon is supplied into crucible 16, and side heater 30 and annular bottom heater 32 heat crucible 16 to about 1420° C., just above the melting point of silicon, so that the silicon melts and substantially fills inner growth zone 22 and outer feed zone 24 with molten silicon.

The growth chamber further comprises pull chamber 40 which extends vertically upwards from the top of crucible chamber 12 and is vacuum isolated from it by puller isolation valve 42. Puller mechanism 44 supports, retracts and extends, and rotates cable 46 having clamp 48 at its lower end to selectively hold crystalline silicon seed 50 of predetermined crystalline orientation. In operation, puller mechanism 44 lowers crystalline silicon seed 50 through the opened puller isolation valve 42 to barely contact melt surface 34 of inner growth zone 22. Under the proper temperature conditions, the silicon at the surface of the inner growth zone melt freezes on crystalline silicon seed 50 with the same crystalline orientation as that of the seed. Puller 44 then slowly raises crystalline silicon seed 50 from the melt as it is rotated such that additional silicon freezes and the crystal expands to form growing ingot 52. In an initial period, the diameter of ingot 52 expands in crown region 54, but the drawing rate is then increased so that the central portion of the ingot 52 has a substantially constant diameter, for example, 200 or 300 mm.

As the length of ingot 52 increases, it will be partially pulled into pull chamber 40. When the desired final length has been achieved, for example, 1 to 2 meters, the pull rate is further increased to create an ingot tail of decreasing diameter which eventually breaks from the melt. The completed ingot is then completely pulled into pull chamber 40, and puller isolation valve 42 closes to isolate pull chamber 40 from crucible chamber 12. When the completed ingot has sufficiently cooled, it is then removed from pull chamber 40, and a new crystalline silicon seed is clamped to puller cable 46 so that a subsequent ingot may be drawn from the same hot crucible 16.

In CCZ, however, the level of melt surface 34 is maintained substantially constant during drawing of ingot 52 by supplying additional silicon to crucible 16 at least intermittently during the drawing of each ingot. In the embodiment of FIG. 1, solid silicon particles 60 in the form of shards or pellets are supplied by feeder 62 selectively penetrating the sidewall of crucible chamber 12 through feeder isolation valve 64. Feeder 62, which may be contained in its own isolation chamber, can be withdrawn from crucible chamber 12 and feeder isolation valve 64 closed to allow resupply of feedstock to feeder 62 or its servicing. Spout 82 is positioned closely over the rotating outer feed zone 26 so that silicon particles 60 drop at a low velocity into outer feed zone 26, in which they melt and eventually are supplied through the aperture 28 into inner growth zone 22 to maintain the level of melt surface 34.

The side insertion of feeder 62 into crucible chamber 12 advantageously allows modification of the zones of crucible 16 and adjustment of the drop radius for the feedstock without major modifications to crucible chamber 12. However, it will be recognized that the feeder can also be located at other positions along the crucible chamber, depending on, for example, the positioning of components within the chamber. For example, the feeder may be inserted through a feeder isolation valve positioned at the top of crucible chamber 12, to provide feedstock from above crucible 16.

Many requirements are imposed on feeder 62 of this specific embodiment of the Czochralski growth system of the present invention. The silicon particles need to be delivered in controlled amounts during ingot growth. The particles need to enter the melt at low velocity to reduce splashing. Parts of feeder 62 are subjected to very high temperatures around the silicon melt. Also, parts of feeder 62 in contact with silicon particles 60 need to not contaminate the silicon. During replenishment, the supply of silicon, usually in a hopper, needs to be in the controlled ambient of crucible chamber 12, but the hopper needs to be replenished after prolonged operation while crucible 16 is still hot. If a problem develops in feeder 62, as many complete parts as possible need to be accessible to technicians while crucible 16 remains hot in the controlled environment. The silicon feedstock tends to be dusty regardless of its source.

Figure 2:
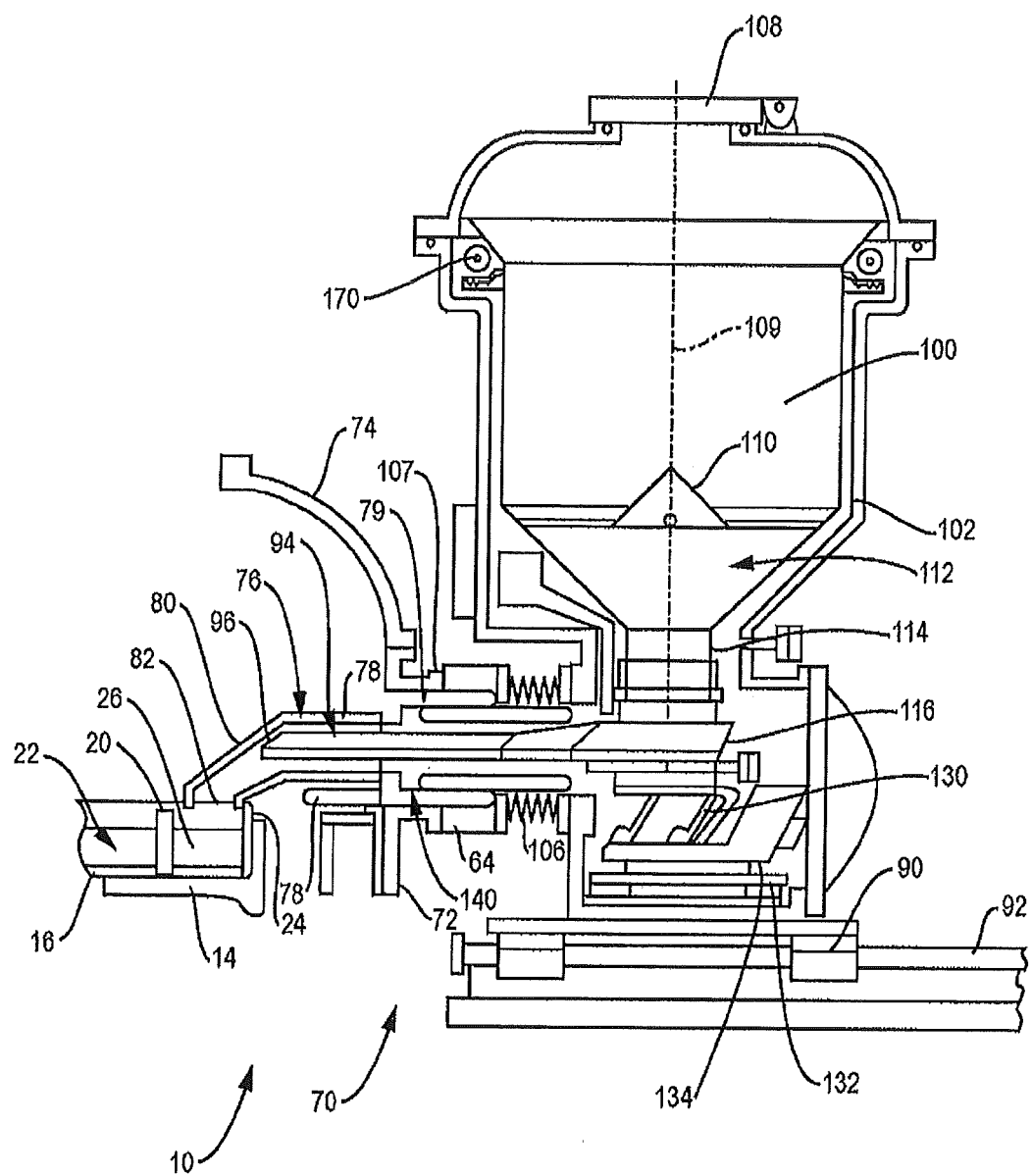
FIG. 2 and FIG. 6 are cross-sectional views of embodiments of a feed system for the Czochralski growth system of the present invention.
Figure 3B:
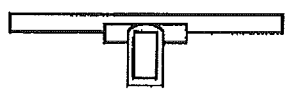
FIG. 3A-D is an orthographic assembly view of an embodiment of a drop box for the Czochralski growth system of the present invention.
Figure 3D:
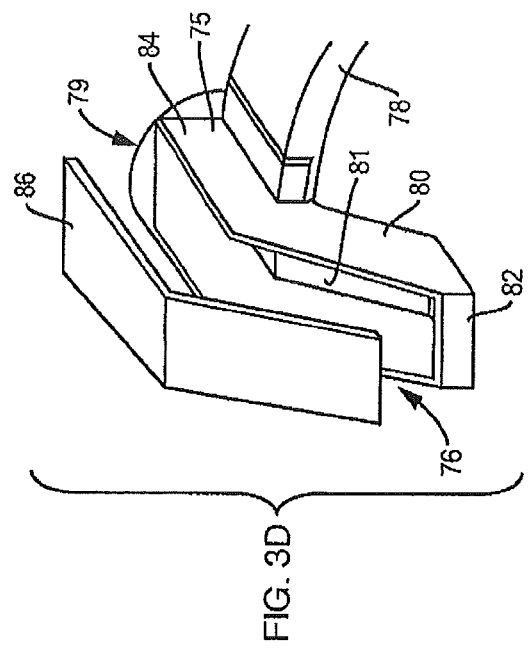
Figure 3A:
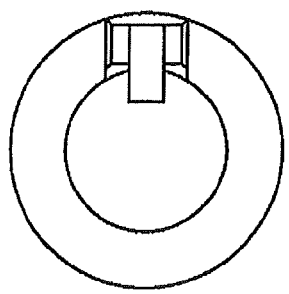
Figure 3C:
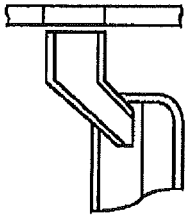
Figure 4:
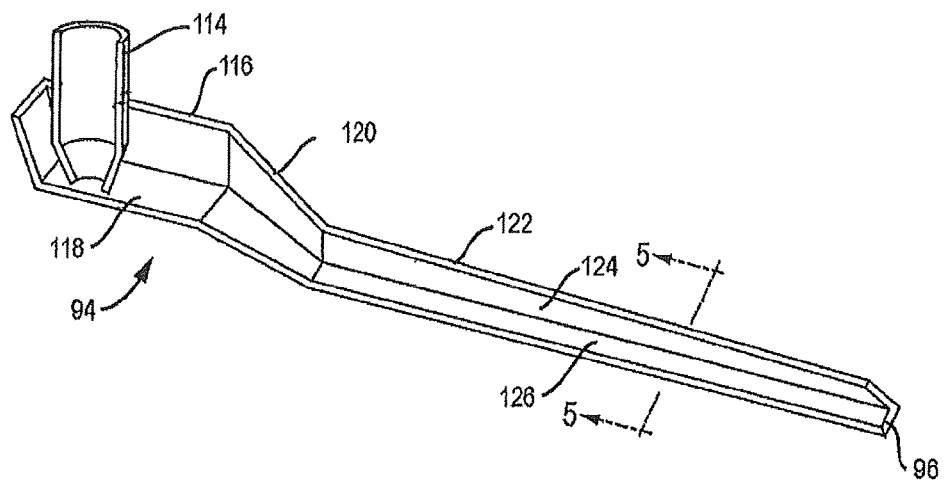
FIG. 4 and FIG. 5 are views of an embodiment of a feeder pan for the Czochralski growth system of the present invention.
Figure 5:
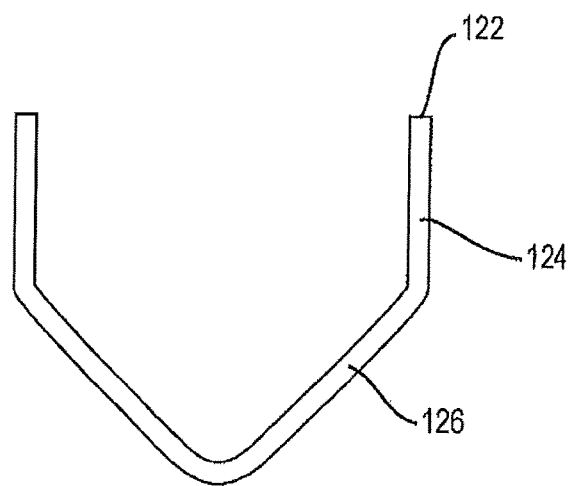

Feed chamber 70, illustrated in some detail in the cross-sectional view of FIG. 2, interfaces with the partially illustrated growth system 10 and supplies silicon feedstock and associated dopants to outer feed zone 26 of crucible 16. Growth chamber 12 includes sidewall 72 having a generally cylindrical shape and dome 74 extending partially over crucible 16 and supporting pull chamber 40. Drop box 76 is fixedly mounted to circumferential purge ring 78 inside growth chamber sidewall 72. As also illustrated in more detail in the orthographic assembly view of FIG. 3, drop box 76 has a generally rectangular cross section and includes horizontally extending receiving section 75 with an open receiving end adjacent to feed port 79 formed in growth chamber sidewall 72 and chute 80 having bottom floor 81 inclined and descending at an angle of between about 30° and 60°, for example, 45° and extending to open spout 82 that completely overlies outer feed zone 26 of crucible 16. Bottom floor 81 of chute 80 needs to be smooth and extend to spout 82 with its end separated from the melt surface by preferably no more than 20 mm so as to minimize splashing. Conveniently, drop box 76 is formed by a trough-shaped bottom 84 and cover 86, both of which are made of a high modulus, non-contaminating material such as silicon carbide, although other refractory materials of sufficient purity and strength may also be used.

If the size of crucible 16 or the locations of its zones are changed, drop box 76 can be easily replaced with one of different dimensions and the extent of insertion of the feeder described below can be easily adjusted.

As shown in FIG. 2, feed chamber 70 is movably mounted by bearings 90 on two tracks 92 extending horizontally and radially from center axis 13 of continuous Czochralski growth system 10. Feed chamber 70 includes a feeder having feeder pan 94 horizontally insertable through feed port 79 into receiving section 75 of drop box 76 such that its spout 82 overlies bottom floor 81 of chute 80 when the CCZ growth system 10 is operating and being supplied by feed chamber 70. Thereby, when silicon feedstock is ejected from feeder pan spout 96, it falls a short distance to bottom floor 81 of chute 80 and slides down the incline of chute 80 before falling a short distance from the spout 82 into the melt of outer feed zone 26. As a result, the silicon feedstock hits the melt at relatively low velocity and does not produce significant ripple or splash.

Feeder pan 94 and feed hopper 100 supplying feedstock to feeder pan 94 are contained within vacuum-tight isolation chamber 102 having its own argon supply and vacuum ports. Isolation chamber 102 is movably mounted on tracks 92 extending along a radius from central axis 13 of crucible chamber 12 and is vacuum-connected through feed port 79 to CCZ growth system 10 through feed isolation valve 64 and a bellows assembly 106. Feeder isolation valve 64 is preferably a water-cooled expandable gate valve, which may also be used for puller isolation valve 42. Feeder isolation valve 64 is bolted to flange 107 around feed port 79, thereby allowing easy separation of feed chamber 70 from CCZ growth system 10 for major maintenance.

When feed hopper 100 needs to be replenished through removable vacuum-sealed hatch cover 108, or when either crucible 16 is being replaced or feed chamber 70 needs to be serviced while the growth system continues in its hot state, isolation chamber 102 is moved away from CCZ growth chamber 10 so as to remove feeder pan 94 from the feed port 79 and out through feed isolation valve 64, compressing bellows assembly 106. Feed isolation valve 64 is then closed, thereby isolating feed chamber 70 from CCZ growth system 10 and allowing external access to feed system 70 without contaminating or disturbing the growth system and also allowing feeder pan 94 to cool away from crucible 16.

Feed hopper 100 is arranged about central axis 109, is quartz-lined, although the liner is optional, and has inverted conical deflector 110 positioned over funnel section 112 and funnel spout 114 to prevent jamming of the solid feedstock. As illustrated in the sectioned orthogonal view of FIG. 4 having the opposed lateral orientation from FIG. 3, funnel spout 114 fits into receiving section 116 of feeder pan 94 having a generally horizontally extending floor 118. The open end of funnel spout 114 is positioned close to floor 118 but sufficiently far away to allow the solid feedstock to move away from funnel spout 114. The bottom lip of funnel spout 114 may be somewhat higher in the downstream direction to facilitate movement of the feedstock particles. Receiving section 116 has a generally rectangular cross section and is connected to chute 120 which descends, such as with decreasing cross section, to injector section 122 extending generally horizontally to feeder pan spout 96, which may be positioned to overlie outer feed zone 26 of crucible 16 when injector section 122 has been extended through feed isolation valve 64 and feed port 79. The bottom of the injector section 122 may be horizontal, that is, not inclined. The illustrated embodiment of feeder pan 94 has an open top but other embodiments may cover parts of the feeder pan. It may be made of silicon carbide or other refractory material similarly to drop box 76.

The irregularly shaped and sometimes elongated silicon shards of specific known size distribution may contain slivers which tend to become oriented transverse to the particle flow and jam in the narrow portions of feeder pan 94. Accordingly, as shown in the cross-sectional view of FIG. 5, at least injector section 122 has a bottom that will tend to align the long dimensions of the irregularly shaped feed along the direction of travel, that is, parallel to the horizontally extending channel or duct, thereby collimating the feedstock. For example, it may have a V-shaped cross section formed by two sloping bottom walls 126, oppositely inclined from the vertical at between about 30° and 60°, for example 45°, and two vertical sidewalls 124. The junction between bottom walls 126 may be sharp or curved. More generally, the bottom may be convex, for example semi-circular. Also, at least injector section 122 may be closed at its top to have a diamond shape or a tubular shape.

Returning to FIG. 2, receiving section 116 of feeder pan 94 is fixed to the top of an electrically driven vibrator 130, the bottom of which is fixed to table 132 through resilient pads 134. Table 132 is suspended from hopper 100 in order that the silicon in feeder pan 94 and in hopper 100 can be weighed together. In operation, the feedstock from hopper 100 fills funnel spout 114 and forms a pile of feedstock between funnel spout 114 and floor 118 of receiving section 116 of feeder pan 94. When vibrator 130 is activated, typically with a series of pulses, the feedstock moves away from funnel spout 114 towards chute 120, down chute 120 towards the injector section 122 and out feeder pan spout 96 into outer feed zone 26 of crucible 16. The number of pulses and their amplitude determine the amount of feed stock so delivered. If the feedstock jams in feeder pan 94, the vibratory amplitude may be increased to break the jam. While for the specific type of feeder shown in FIG. 2, it is preferred to use a vibratory motion to transport the feedstock into the crucible, other types of feeders or conveyers can also be used in which vibrator 130 is not necessary. For example, a non-vibrating feeder comprising either a stationary outer tube with an internally rotating screw, or a rotating, internally threaded outer tube with a stationary core element, can be used to deliver feedstock to the crucible. Other feeder types that can be used will be known to one of ordinary skill in the art.

Feeder pan 94 may have an open top, and silicon dust and particles may be ejected from feeder pan 94 and settle into the passageway that accommodates it. Also, when feeder pan 94 is withdrawn from growth chamber 10, silicon particles can spill from feeder pan spout 96. If the dust and particles settle into the mechanism of isolation valve 64 or into the folds of bellows assembly 106, the system may become inoperable perhaps with punctured bellows, requiring a major cleaning or overhaul and interrupting an ingot nm. Accordingly, as illustrated in the cross-sectional view of FIG. 6, injector section 122 of feeder pan 94 is disposed within a telescoping shield having a generally tubular shape, which includes back shield 142, having its back end fixed to isolation chamber 102 and front shield 140 slidably closely accommodated within back shield 142.

As shown, bellows assembly 106 is composed of front bellows 144 and back bellows 146 having inner ends sealed to carrier plate 148 that freely slides on tracks 92 but is biased away from isolation chamber 102 by a pair of springs 150. The back end of back bellows 146 is sealed to isolation chamber 102. The front end of front bellows 144 is sealed to quick-release coupling 154 including sealing ring 156 axially sealably engageable with flange 158 sealed to isolation valve 64. Ring clamp ring 160 having two handles 162 is manually rotatable to engage hooks 164 on ring clamp ring 160 to pins 168 on flange 158 and to thus tighten the O-ring seal between sealing ring 156 and flange 158.

Figure 6:
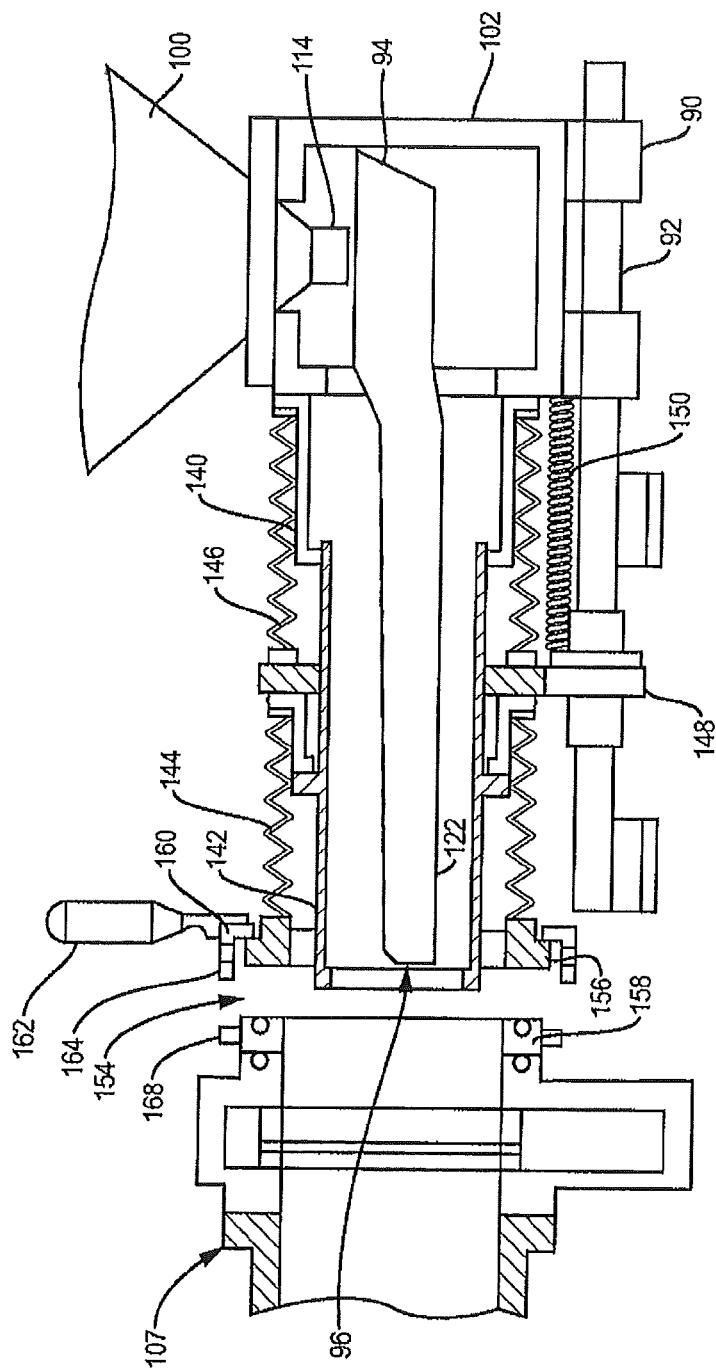

In the withdrawn and detached positioning of FIG. 6 with quick release coupling 154 released and feeder pan 94 pulled away from growth chamber 72, springs 150 bias inner shield 142 to the left so that inner (back) shield 142 and the front shield 140 are interposed between front and back bellows 144 and 146 and injector section 122 of feeder pan 94, including feeder pan spout 96 of feeder pan 94. When feeder pan 94 is to be returned to its operational position partially within growth chamber 72 by pushing isolation chamber 102 to the left, sealing ring 156 engages flange 158 and is sealed to it by operating quick release coupling 154. Further movement compresses front bellows 144 but springs 150 continue to bias inner shield 142 forwardly so that it covers spout 164 as it passes through isolation valve 64. Yet further movement will begin to compress springs 150 so that the motion of inner shield 142 is slowed and injector section 122 of feeder pan 94 projects beyond inner shield 142 and feeder pan spout 96 assumes its operational position over the sloping floor 81 inside drop box 76.

Feed chamber 70 may be isolated from CCZ growth system 10 by closing isolation valve 64 but remain mechanically attached to it through sealed quick release coupling 154 so that isolation chamber 102 may be maintained at vacuum by its own gas supply and vacuum pump ports. Alternatively, isolation chamber 102 may be opened for replenishing feed hopper 100. In the isolated attached condition, isolation chamber 102 is withdrawn enough to place injector section 122 of feeder pan 94 and its surrounding inner shield 142 on the feeder side of isolation valve 64.

It is important to reduce back flow of argon from CCZ growth system 10 into feed chamber 70 since a uniform downward flow of argon around crucible 16 is desired to reduce non-uniformities of the melt. Stationary drop box 76 can be designed to not excessively interfere with the downward gas flow and the inner shield nose 156 can closely conform to feeder pan 94 to minimize gas flow into feed chamber 70.

Sufficient silicon feedstock should be delivered to maintain a controlled level of melt surface 34 in crucible 16. That is, if the melt level drops, more feedstock should be supplied to return the melt level to its prior height. A nearly constant melt level is the desired control condition for most running conditions. However, if a changing melt level is desired, then the system should be able to modify the melt level in a controlled, known manner. One technique for controlling the level of melt surface 34 is to control the fed weight. The weight of growing ingot 52 can be measured with load cells associated with pull mechanism 44 and the weight of undelivered feedstock can be measured by three load cells 170, illustrated in FIG. 2, supporting hopper 110 from isolation chamber 102. Table 132 for vibrator 130 and feeder pan 94 supported by it are suspended from hopper 110 so that all undelivered feedstock is being measured. These two sets of load cells monitor the weight of all solid silicon in the system away from crucible 16. If a controller determines that the sum of the two weights increases, the increase represents a lowering in the height of the level of melt surface 34 indicating the need to supply more feedstock to crucible 16 and the controller accordingly activates vibrator 130 to deliver sufficient feedstock to replenish crucible 16. The load cells are additionally weighing pull mechanism 44 and hopper 110 and portions of feed chamber 70 supported by hopper 110, but these parts of the apparatus do not change during the ingot drawing so any variation can attributed to the silicon.

Another technique for controlling the level of melt surface 34 is to monitor using optical or non-contact means such as laser triangulation from a laser beam reflected from the melt surface, or utilizing image analysis captured from a real-time optical camera. In either of these forms of control, the measurement is an indirect means to obtain the required mass balance and further calculation is required to maintain or control the level of melt surface 34.

If the ingot is to be grown with a predetermined type and concentration of dopant, unillustrated dopant dispensers may be positioned over feeder pan 94 in its operational position to dispense into the feedstock stream selected amounts of dopant compared to the amount of silicon feedstock being supplied.

Although the described system is particularly useful for continuous Czochralski silicon growth, various aspects of the invention can be applied to other high-temperature growth systems.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A Czochralski growth system, comprising:
a growth chamber comprising a crucible, at least one sidewall, a top wall, a pedestal for supporting the crucible, a drop box fixedly mounted to an inside of the growth chamber, and a pull mechanism for retractably supporting a seed for contacting a melt contained in the crucible, wherein the crucible comprises an inner zone positioned under the pull mechanism and an annular outer zone in fluid communication with the inner zone and disposed under a spout of the drop box;
a feed port positioned in the at least one sidewall of the growth chamber so that feedstock enters the growth chamber having overall path of delivery of the feedstock of between 0° and about 20° from horizontal at a center of the feed port and into the outer zone of the crucible; and
a feed chamber attached to the growth chamber at the feed port, the feed chamber comprising a feed hopper, a funnel spout for the feedstock and a feeder insertable into the growth chamber through the feed port to supply the feedstock into the growth chamber.

2. The Czochralski growth system of claim 1, wherein the feed chamber further comprises an isolation valve.

3. The Czochralski growth system of claim 2, wherein the isolation valve is between the feed hopper and the feeder.

4. The Czochralski growth system of claim 2, wherein the isolation valve is a gate valve with an expandable water-cooled gate.

5. The Czochralski growth system of claim 1, wherein the drop box comprises a horizontally extending receiving section and a chute having a sloping bottom for receiving the feedstock from the feeder, and a spout positioned over the crucible.

6. The Czochralski growth system of claim 5, wherein the sloping bottom is inclined at an angle of between about 30° and about 60°.

7. The Czochralski growth system of claim 1, wherein the feeder comprises a feeder pan having a receiving section for receiving the feedstock from an opening of the funnel spout of the feed hopper and an injector section connected to and having a cross section smaller than the receiving section and insertable through the feed port into the growth chamber.

8. The Czochralski growth system of claim 7, wherein the injector section has a concave bottom.

9. The Czochralski growth system of claim 8, wherein the concave bottom has a V shape with walls oppositely inclined from vertical at between about 30° and about 60°.

10. The Czochralski growth system of claim 1, wherein the growth system does not comprise an isolation valve.

* * * * *